United States Patent
Kang et al.

(10) Patent No.: US 9,112,047 B2
(45) Date of Patent: Aug. 18, 2015

(54) SPLIT GATE NON-VOLATILE MEMORY (NVM) CELL AND METHOD THEREFOR

(71) Applicants: Sung-Taeg Kang, Austin, TX (US); Cheong Min Hong, Austin, TX (US)

(72) Inventors: Sung-Taeg Kang, Austin, TX (US); Cheong Min Hong, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 170 days.

(21) Appl. No.: 13/779,859

(22) Filed: Feb. 28, 2013

(65) Prior Publication Data
US 2014/0239372 A1    Aug. 28, 2014

(51) Int. Cl.
*H01L 29/792* (2006.01)
*H01L 21/28* (2006.01)
*H01L 29/423* (2006.01)
*H01L 29/66* (2006.01)

(52) U.S. Cl.
CPC ...... *H01L 29/7926* (2013.01); *H01L 21/28282* (2013.01); *H01L 29/4234* (2013.01); *H01L 29/42348* (2013.01); *H01L 29/66833* (2013.01)

(58) Field of Classification Search
None
See application file for complete search history.

(56) References Cited

U.S. PATENT DOCUMENTS

| 5,414,287 | A  | 5/1995 | Hong |
| 6,881,994 | B2 | 4/2005 | Lee et al. |
| 7,052,941 | B2 | 5/2006 | Lee |
| 7,208,796 | B2 | 4/2007 | Chang et al. |
| 7,544,980 | B2 | 6/2009 | Chindalore et al. |

*Primary Examiner* — Marvin Payen

(57) ABSTRACT

A split gate memory structure includes a pillar of active region having a first source/drain region disposed at a first end of the pillar, a second source/drain region disposed at a second end of the pillar, opposite the first end, and a channel region between the first and second source/drain regions. The pillar has a major surface extending between first and the second ends which exposes the first source/drain region, the channel region, and the second source/drain region. A select gate is adjacent the first source/drain region and a first portion of the channel region, wherein the select gate encircles the major surface the pillar. A charge storage layer is adjacent the second source/drain region and a second portion of the channel region, wherein the charge storage layer encircles the major surface the pillar. A control gate is adjacent the charge storage layer, wherein the control gate encircles the pillar.

17 Claims, 4 Drawing Sheets

US 9,112,047 B2

SPLIT GATE NON-VOLATILE MEMORY (NVM) CELL AND METHOD THEREFOR

BACKGROUND

1. Field

This disclosure relates generally to non-volatile memories (NVMs), and more specifically, to split gate NVM cells.

2. Related Art

Non-volatile memories (NVMs) continue to be under pressure to become smaller and smaller. Two examples of difficulties that are associated with this process in the context of NVMs are leakage due to gate lengths being reduced and weakened isolation between cells due to reduced dimensions. These are difficulties are thus exacerbated with reduced dimensions. There is more involved than just reducing dimensions of NVM cells according to the reductions that become available due to improved manufacturing processes.

Accordingly there is a need to improve upon one or more of the issues raised above in the context of NVM cells including split gate NVM cells.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a split gate non-volatile memory (NVM) cell uses a vertical semiconductor pillar extending orthogonally above a semiconductor substrate. The pillar has a channel region between source and drain regions. A select gate is formed to substantially encircle the pillar up to a portion of the channel region. A nanocrystal charge storage layer is formed resulting in a portion of the nanocrystals in close proximity to the portion of the channel not covered by the select gate. A control gate is then formed over the nanocrystal charge storage layer including being in close proximity to the nanocrystals in close proximity to the channel region. This is better understood by reference to the drawings and the following description.

The semiconductor substrate described herein can be any semiconductor material or combinations of materials, such as gallium arsenide, silicon germanium, silicon-on-insulator (SOI), silicon, monocrystalline silicon, the like, and combinations of the above, but a top silicon layer would be preferable.

Figure 1:
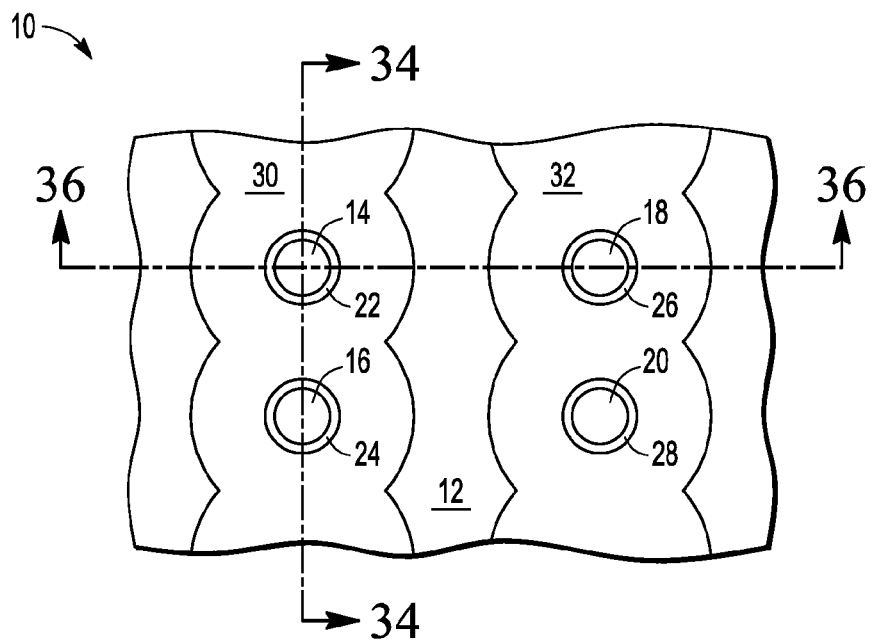
FIG. 1 is a top view at a stage in processing of a portion of an array of split gate NVM cells.
Figure 2:
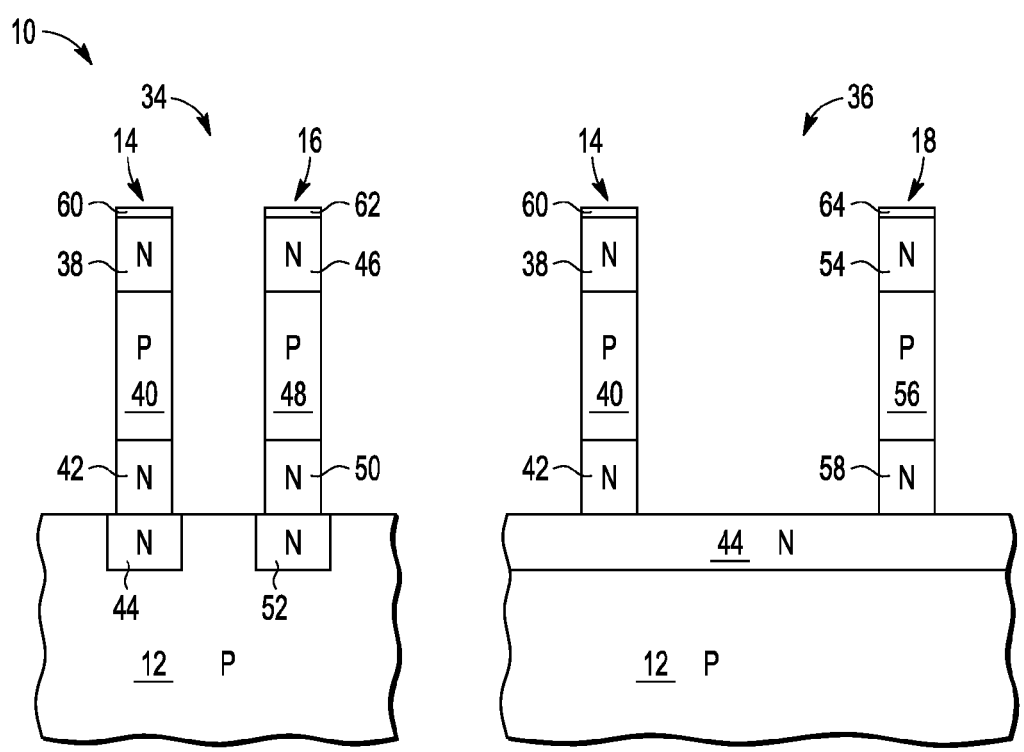
FIG. 2 shows cross sections of the array of FIG. 1 at a preceding stage in processing.
Figure 3:
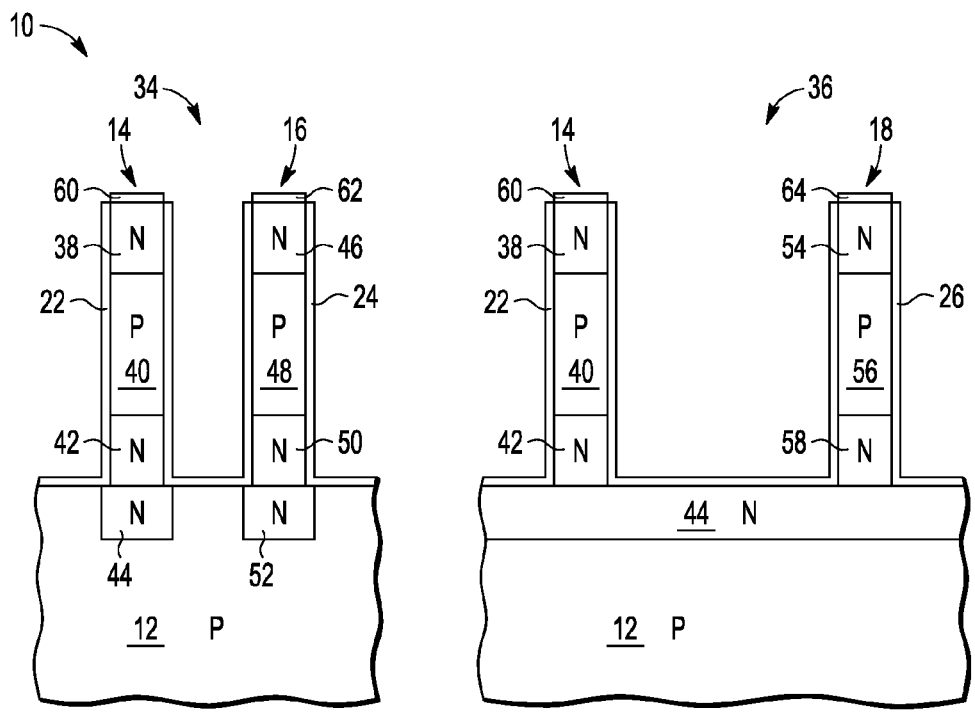
FIG. 3 shows cross sections of the array of FIG. 1 at a stage in processing subsequent to that shown in FIG. 2.
Figure 4:
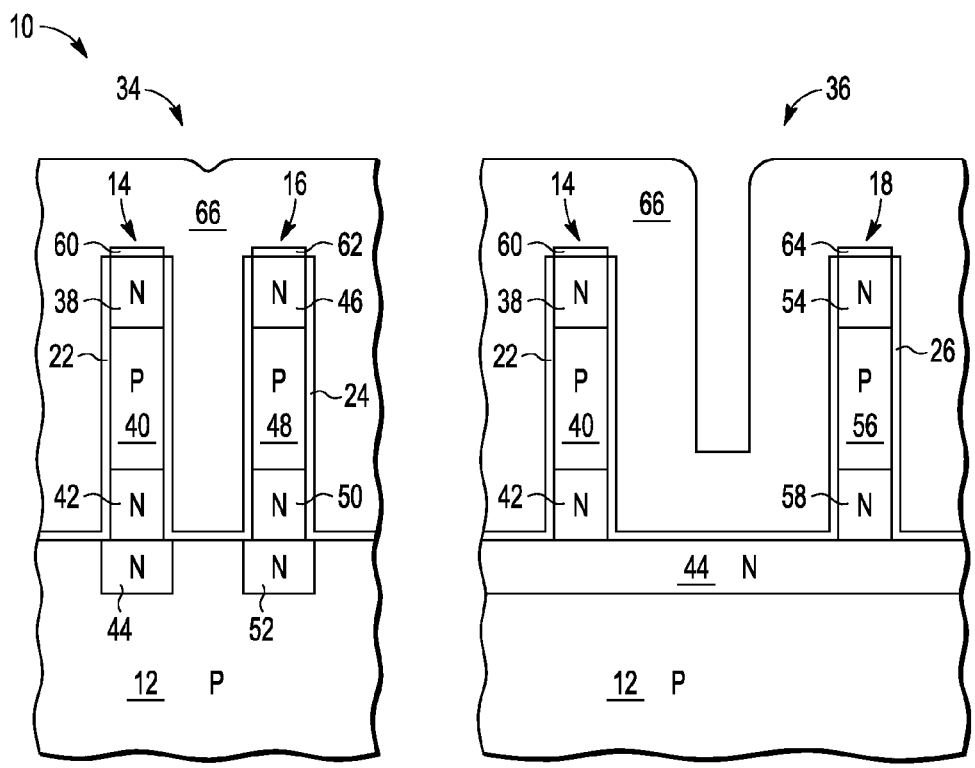
FIG. 4 shows cross sections of the array of FIG. 1 at a stage in processing subsequent to that shown in FIG. 3.
Figure 5:
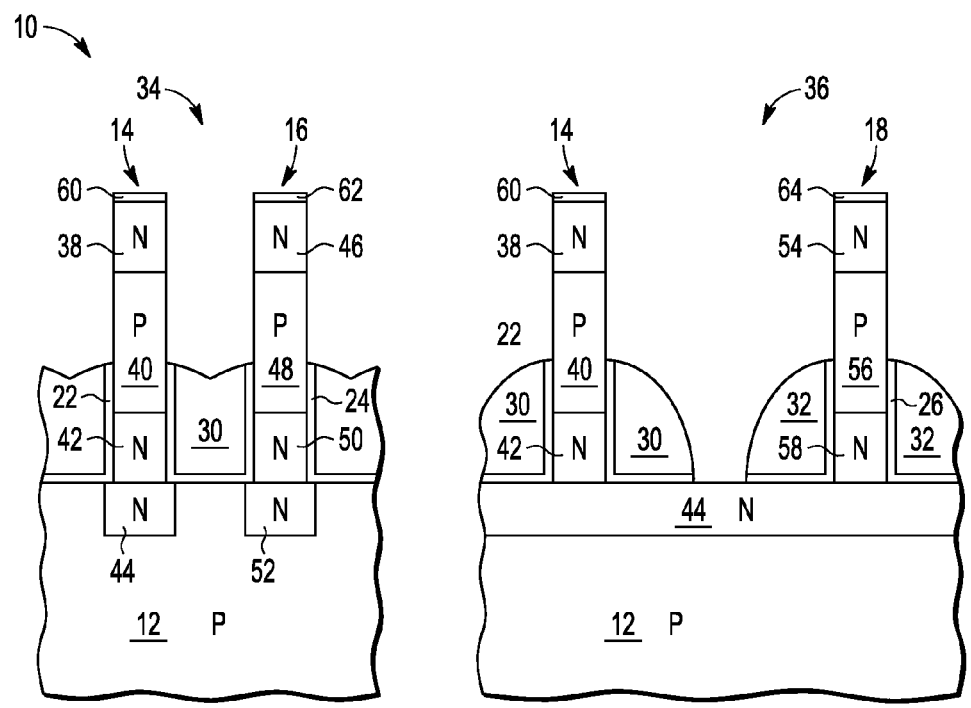
FIG. 5 shows cross sections of the array of FIG. 1 at the stage in processing shown in FIG. 1 and subsequent to that shown in FIG. 4.
Figure 6:
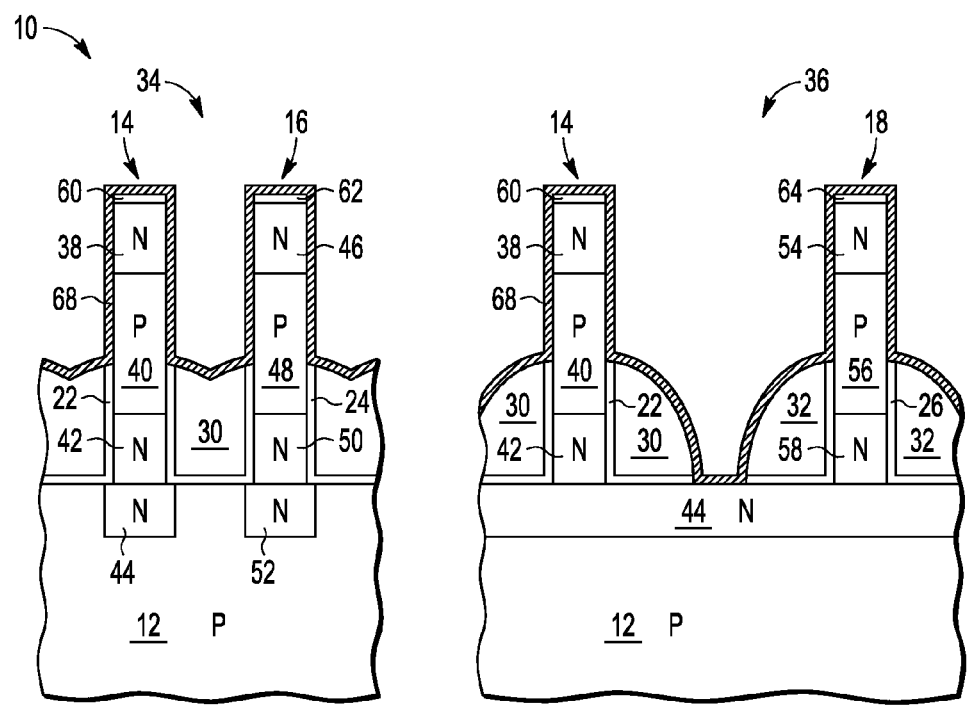
FIG. 6 shows cross sections of the array of FIG. 1 at a stage in processing subsequent to that shown in FIG. 5.
Figure 7:
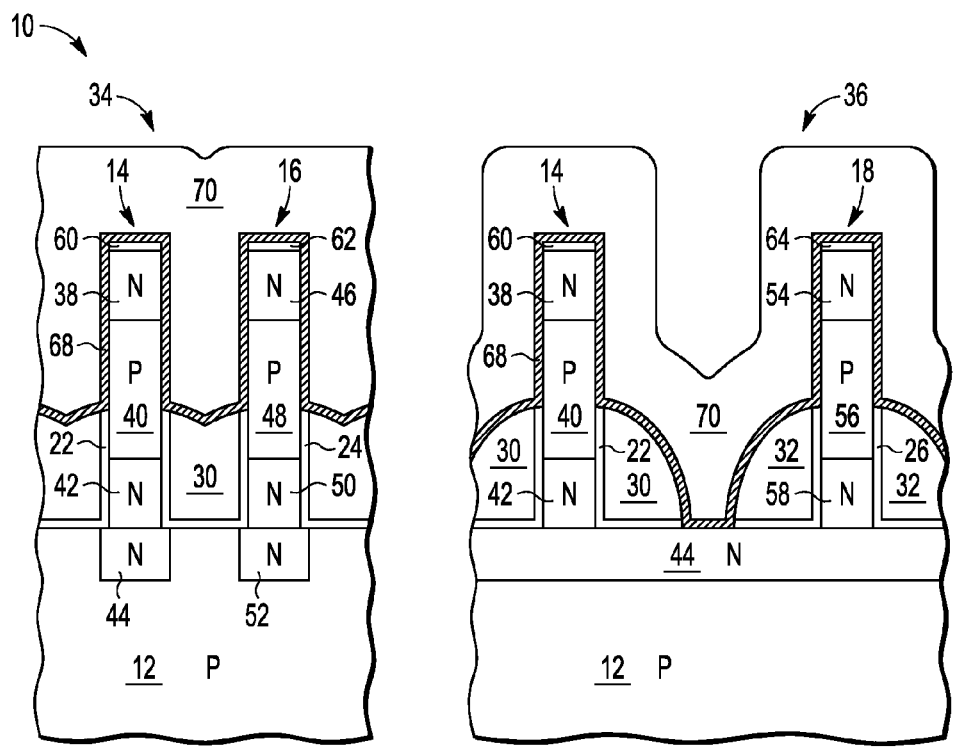
FIG. 7 shows cross sections of the array of FIG. 1 at a stage in processing subsequent to that shown in FIG. 6.
Figure 8:
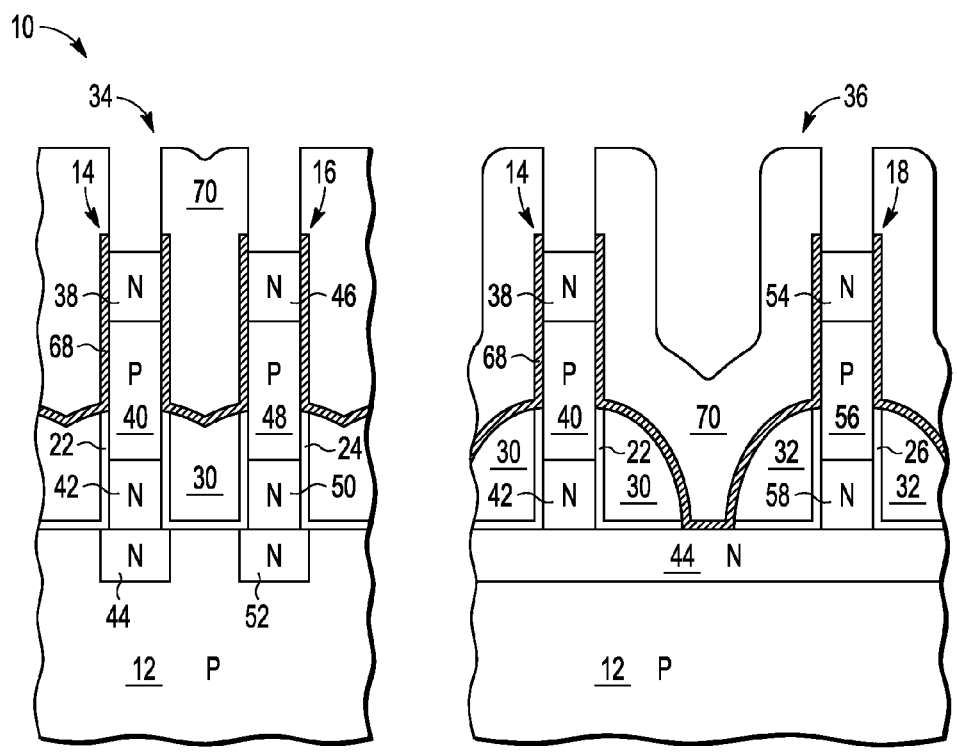
FIG. 8 shows cross sections of the array of FIG. 1 at a stage in processing subsequent to that shown in FIG. 7.

Shown in FIG. 1 is a top view of a semiconductor device 10 that shows a portion of a split gate non-volatile memory (NVM) array at a stage in processing. Semiconductor device 10 includes a substrate 12 that may be silicon, a pillar 14, a pillar 16, a pillar 18, a pillar 20, a gate dielectric 22 on pillar 14, a gate dielectric 24 on pillar 16, a gate dielectric 26 on pillar 18, a gate dielectric 28 on pillar 20, a conductive line 30 encircling pillars 14 and 16, and a conductive line 32 encircling pillars 18 and 20. Conductive lines 30 and 32 function as word lines for the array and as select gates. Conductive line 30 functions as the select gate for the NVM cells to be formed using pillars 14 and 16, and conductive 32 functions as the select gate for the NVM cells to be formed using the pillars 18 and 20. Each pillar 14, 16, 18, and 20 is effectively the location of a memory cell in the array of semiconductor device 10 with conductive lines 30 and 32 running in one direction and bit lines, which are not shown, run orthogonally to conductive lines 30 and 32. The control gates are not yet formed and thus not shown. Shown in FIG. 1 are cross section lines 34 and 36. FIGS. 2-8 show progressive stages in forming NVM cells at the locations indicated by cross section lines 34 and 36. FIGS. 2-4 show stages prior to that of FIG. 1. FIG. 5 shows the same stage as FIG. 1. FIGS. 6-8 show stages after that of FIGS. 1 and 5. Pillars 14, 16, 18, and 20 may each have a diameter of about 500 Angstroms. Gate dielectrics 22, 24, 26, and 28 may have a thickness of about 20 Angstroms. In the row direction, for example between pillars 14 and 18, the pillars may be about 2000 Angstroms apart. In the column direction, for example between pillars 14 and 16, the pillars may be about a 1000 Angstroms apart. All of these dimensions can vary; both smaller and larger. In the case of the diameter of the pillars, it is preferably less than or equal to 1000 Angstroms.

Shown in FIG. 2 is semiconductor device 10 showing cross sections 34 and 36 after forming doped regions 44 and 52 in substrate 12, pillar 14 over doped region 44, pillar 16 over doped region 52, and pillar 18 over doped region 44. Pillar 20 is formed over doped region 52 but pillar 20 is not in either cross section 34 or 36 and thus not shown in FIG. 2 or any of the subsequent FIGS. Substrate 12 is P type and doped regions 42 and 52 are within substrate 12 and N type. Pillar 14 has a doped region 42 that is N type, a doped region 40 that is P type, and a doped region 38 that is N type. Pillar 16 has a doped region 50 that is N type, a doped region 48 that is P type, and a doped region 46 that is N type. Pillar 18 has a doped region 58 that is N type, a doped region 56 that is P type, and a doped region 54 that is N type. Doped regions 42, 50, and 58 are used as drains. Doped regions 40, 48, and 56 are used as channel regions. Doped regions 38, 46, and 54 are used as sources. On the top of pillars 14, 16, and 18 are hard mask layers 60, 62, and 64, respectively, that may be nitride. Doped regions 44 and 52 function as bit lines. Pillars 14, 16, 18, and 20 may be from epitaxially grown silicon layers from substrate 12 for substrate 12 being silicon that are in situ doped to form doped layers. After the epitaxial growth, pillars 14, 16, and 18 can be formed by a selective etch of the epitaxial layer.

Shown in FIG. 3 is semiconductor device 10 after forming a gate dielectric layer that is gate dielectric layer 22 on pillar 14, gate dielectric layer 24 on pillar 16, and gate dielectric layer 26 on pillar 18. This may be an oxide layer grown at high relatively high temperature such as 1000 degrees Celsius.

Shown in FIG. 4 is semiconductor device 10 after depositing a conductive layer 66 that is conformal and may be about 750 Angstroms thick. Conductive layer 66 may be polysilicon that is doped. Conductive layer 66 completely fills the region between pillars 14 and 16 whereas conductive layer 66 is only about 750 Angstroms above substrate 12 in a portion of the region between pillars 14 and 18.

Shown in FIG. 5 is semiconductor device 10 after etching back using an anisotropic etch which removes layer 66 in a middle portion between pillars 14 and 18 but is retained between pillars 14 and 16. The result is also shown in FIG. 1. The result of the etch of conductive layer is to leave a conductive layer 30 encircling pillars 14 and 16 and a conductive layer 32 encircling pillar 18 as shown in FIG. 5 and also encircling pillar 20 as shown in FIG. 1. Conductive layers 30 and 32 may be considered sidewall spacers as being formed from a conformal deposition followed by an anisotropic etch. The height of these sidewall spacers of conductive material is chosen to cover about a third of channel regions 40, 48, and 56. Thus about of the third of channel is for the select gate leaving about two thirds for the control gate. The exposed portions of deposited dielectric layers 22, 24, 26, and 28 are removed after forming conductive layers 30 and 32.

Shown in FIG. 6 is semiconductor device 10 after forming a charge storage layer 68 over semiconductor device 10. Charge storage layer 68 may be of nanocrystals. Charge storage layer 68 is in close proximity to about two thirds of each of the channel regions such as channel regions 40, 48, and 56 shown in FIG. 6.

Shown in FIG. 7 is semiconductor device 10 after forming a conductive layer 70 over charge storage layer 68. Charge storage layer is thus on charge storage layer 68 where charge storage layer 68 is in close proximity to the channel regions. Conductive layer 70 thus is used as a control gate for the memory cells of semiconductor device 10. Conductive layer 70 may be polysilicon, which may be subsequently silicided, of about a thickness of about 600 Angstroms. The thickness would increase with silicidation. As for the all of the dimensions, this thickness can vary. The control gate may be common for all of the memory cells for a given array such as the array shown in FIG. 1.

Shown in FIG. 8 is semiconductor device after opening the top side of pillars 14, 16, and 18 and the removal of hard masks 60, 62, and 64. Programming is achieved through this opening to the sources which are doped regions 38, 46, and 54. Contact to the select gate can be at the end of the word line. If that is too much distance a dummy pillar can be added and access to the select gate can be made along the dummy pillar. This shows a completed split gate NVM cells. Using pillar 14 as an example, conductive line 30 functioning as the select gate encircles pillar 14 and controls about one third of the channel while conductive layer 70 functioning as the control gate controls about two thirds of the channel. The source is accessible at the top of pillar 14. The bit line is contacted through the connection between doped regions 44 and 42.

By now it should be appreciated that there has been provided a split gate memory structure that includes a pillar of active region, a select gate, a charge storage layer, and control gate. The pillar of active region has a first source/drain region disposed at a first end of the pillar, a second source/drain region disposed at a second end of the pillar, opposite the first end, and a channel region between the first and second source/drain regions, wherein the pillar has a major surface extending between first and the second ends, wherein the major surface exposes the first source/drain region, the channel region, and the second source/drain region. The select gate is adjacent the first source/drain region and a first portion of the channel region, wherein the select gate encircles the major surface the pillar. The charge storage layer is adjacent the second source/drain region and a second portion of the channel region, wherein the charge storage layer encircles the major surface the pillar. The control gate is adjacent the charge storage layer, wherein the control gate encircles the pillar and wherein the charge storage layer is between the control gate and the pillar. The split gate memory structure may further include a semiconductor layer, wherein the pillar of active region extends substantially vertically from the semiconductor layer. The split gate memory structure may have a further characterization by which the first source/drain region is in physical contact with the semiconductor layer. The split gate memory structure may have a further characterization by which the control gate overlaps a portion of the select gate such that the overlapped portion of the select gate is between the control gate and the pillar. The split gate memory structure may have a further characterization by which the charge storage layer is between the control gate and the overlapped portion of the select gate. The split gate memory structure may further include a gate dielectric layer between the select gate and the pillar, encircling the first source/drain region and the first portion of the channel region. The split gate memory structure may have a further characterization by which an average diameter of the pillar is less than or equal to 1000 Angstroms.

Also described is a split gate memory structure that includes a semiconductor layer, a pillar, a select gate, a charge storage layer, and a control gate. The pillar is on the semiconductor layer and substantially perpendicular to the semiconductor layer, wherein the first pillar has a first source/drain region disposed at a first end of the pillar on the semiconductor layer, a second source/drain region disposed at a second end of the pillar, opposite the first end, and a channel region between the first and second source/drain regions. The select gate is over the semiconductor layer and adjacent the first source/drain region and a first portion of the channel region. The charge storage layer is adjacent the second source/drain region and a second portion of the channel region above the first portion of the channel region, and over the select gate. The control gate is adjacent the charge storage layer, the second source/drain region, and the second portion of the channel region and over the select gate. The split gate memory structure may have a further characterization by which the charge storage layer is between the control gate and the select gate. The split gate memory structure may have a further characterization by which the select gate is not adjacent the second portion of the channel region and the second source/drain region. The split gate memory structure may have a further characterization by which the charge storage layer comprises nanocrystals. The split gate memory structure may further include a gate dielectric layer between the select gate and the pillar. The split gate memory structure may have a further characterization by which the select gate substantially encircles the first source/drain region and the first portion of the channel region. The split gate memory structure may have a further characterization by which the charge storage layer substantially encircles the second source/drain region, the second portion of the channel region, and the select gate and the control gate substantially encircles the second source/drain region, the second portion of the channel region, and the select gate, wherein the charge storage layer is between the control gate and the pillar and between the control gate and the select gate. The split gate memory structure may further include a contact on the second end of the pillar, wherein the control gate substantially encircles the contact. The split gate memory may further include a second pillar on the semiconductor layer and substantially perpendicular to the semiconductor layer, wherein the second pillar is laterally spaced apart from the pillar, and the second pillar has a first source/drain region disposed at a first end of the second pillar on the semiconductor layer, a second source/drain region disposed at a second end of the second pillar, opposite the first end of the second pillar, and a channel region between the first and second source/drain regions of the second pillar, a second select gate over the semiconductor layer and adjacent the first source/drain region of the second pillar and a first portion of the channel region of the second pillar, a second charge storage layer adjacent the second source/drain region of the second pillar and a second portion of the channel region of the second pillar above the first portion of the channel region of the second pillar, and over the second select gate, and a second control gate adjacent the second charge storage layer, the second source/drain region of the second pillar, and the second portion of the channel region of the second pillar and over the second select gate. The split gate memory structure may have a further characterization by which the select gate is in direct physical contact with the second select gate.

Described also is a method for forming a split gate semiconductor structure. The method includes forming a pillar on a semiconductor layer which extends substantially vertically from the semiconductor layer, wherein the pillar comprises a first source/drain region on the semiconductor layer, a channel region on the first source/drain region, and a second source/drain region on the channel region. The method includes forming a select gate over the semiconductor layer, encircling the first source/drain region of the pillar and a first portion of the channel region of the pillar. The method includes forming a charge storage layer over the select gate and encircling the second source/drain region of the pillar and a second portion of the channel region of the pillar above the first portion of the channel region of the pillar. The method includes forming a control gate over the select gate and encircling the second source/drain region of the pillar and the second portion of the channel region, wherein the charge storage layer is between the control gate and the pillar. The method may have a further characterization by which forming the control gate is performed such that the control gate overlaps a portion of the select gate to form an overlapped portion of the select gate, and the charge storage layer is between the control gate and the overlapped portion of the select gate. The method may further include, prior to forming the select gate, forming a gate dielectric layer adjacent the pillar.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the doping types are given for the example of a N channel type memory cell whereas it may be feasible to implement a P channel type memory cell in which case the doping types would be reversed as needed. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A split gate memory structure comprising:
    a pillar of active region having a first source/drain region disposed at a first end of the pillar, a second source/drain region disposed at a second end of the pillar, opposite the first end, and a channel region between the first and second source/drain regions, wherein the pillar has a major surface extending between first and the second ends, wherein the major surface exposes the first source/drain region, the channel region, and the second source/drain region;
    a select gate adjacent the first source/drain region and a first portion of the channel region, wherein the select gate encircles the major surface the pillar;
    a charge storage layer adjacent the second source/drain region and a second portion of the channel region, wherein the charge storage layer encircles the major surface the pillar; and
    a control gate adjacent the charge storage layer, wherein the control gate encircles the pillar and wherein the charge storage layer is between the control gate and the pillar.

2. The split gate memory structure of claim 1, further comprising a semiconductor layer, wherein the pillar of active region extends substantially vertically from the semiconductor layer.

3. The split gate memory structure of claim 2, wherein the first source/drain region is in physical contact with the semiconductor layer.

4. The split gate memory structure of claim 1, wherein the control gate overlaps a portion of the select gate such that the overlapped portion of the select gate is between the control gate and the pillar.

5. The split gate memory structure of claim 4, wherein the charge storage layer is between the control gate and the overlapped portion of the select gate.

6. The split gate memory structure of claim 1, further comprising:
    a gate dielectric layer between the select gate and the pillar, encircling the first source/drain region and the first portion of the channel region.

7. The split gate memory structure of claim 1, wherein an average diameter of the pillar is less than or equal to 1000 Angstroms.

8. A split gate memory structure, comprising:
    a semiconductor layer;
    a pillar on the semiconductor layer and substantially perpendicular to the semiconductor layer, wherein the first pillar has a first source/drain region disposed at a first end of the pillar on the semiconductor layer, a second source/drain region disposed at a second end of the pillar, opposite the first end, and a channel region between the first and second source/drain regions;

a select gate over the semiconductor layer and adjacent the first source/drain region and a first portion of the channel region;

a charge storage layer adjacent the second source/drain region and a second portion of the channel region above the first portion of the channel region, and over the select gate; and a control gate adjacent the charge storage layer, the second source/drain region, and the second portion of the channel region and over the select gate.

9. The split gate memory structure of claim 8, wherein the charge storage layer is between the control gate and the select gate.

10. The split gate memory structure of claim 8, wherein the select gate is not adjacent the second portion of the channel region and the second source/drain region.

11. The split gate memory structure of claim 8, wherein the charge storage layer comprises nanocrystals.

12. The split gate memory structure of claim 8, further comprising:
a gate dielectric layer between the select gate and the pillar.

13. The split gate memory structure of claim 8, wherein the select gate substantially encircles the first source/drain region and the first portion of the channel region.

14. The split gate memory structure of claim 13, wherein the charge storage layer substantially encircles the second source/drain region, the second portion of the channel region, and the select gate; and the control gate substantially encircles the second source/drain region, the second portion of the channel region, and the select gate, wherein the charge storage layer is between the control gate and the pillar and between the control gate and the select gate.

15. The split gate memory structure of claim 14, further comprising:
a contact on the second end of the pillar, wherein the control gate substantially encircles the contact.

16. The split gate memory structure of claim 8, further comprising:
a second pillar on the semiconductor layer and substantially perpendicular to the semiconductor layer, wherein the second pillar is laterally spaced apart from the pillar, and the second pillar has a first source/drain region disposed at a first end of the second pillar on the semiconductor layer, a second source/drain region disposed at a second end of the second pillar, opposite the first end of the second pillar, and a channel region between the first and second source/drain regions of the second pillar;

a second select gate over the semiconductor layer and adjacent the first source/drain region of the second pillar and a first portion of the channel region of the second pillar;

a second charge storage layer adjacent the second source/drain region of the second pillar and a second portion of the channel region of the second pillar above the first portion of the channel region of the second pillar, and over the second select gate; and a second control gate adjacent the second charge storage layer, the second source/drain region of the second pillar, and the second portion of the channel region of the second pillar and over the second select gate.

17. The split gate memory structure of claim 16, wherein the select gate is in direct physical contact with the second select gate.

* * * * *